United States Patent
Ripley et al.

(10) Patent No.: US 11,646,701 B2
(45) Date of Patent: May 9, 2023

(54) POWER AMPLIFIER OUTPUT POWER PROTECTION

(71) Applicant: SKYWORKS SOLUTIONS, INC., Irvine, CA (US)

(72) Inventors: David Steven Ripley, Marion, IA (US); Joshua James Caron, Madison, NC (US); Vinay Kundur, San Jose, CA (US); Wei Zhang, Oak Park, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 125 days.

(21) Appl. No.: 17/176,103

(22) Filed: Feb. 15, 2021

(65) Prior Publication Data

US 2021/0281223 A1    Sep. 9, 2021

Related U.S. Application Data

(63) Continuation of application No. 16/586,711, filed on Sep. 27, 2019, now Pat. No. 10,951,178.

(60) Provisional application No. 62/738,928, filed on Sep. 28, 2018.

(51) Int. Cl.
  *H03F 1/52*  (2006.01)
  *H03F 3/213*  (2006.01)
  *H03F 1/02*  (2006.01)

(52) U.S. Cl.
  CPC ............. *H03F 1/52* (2013.01); *H03F 1/0211* (2013.01); *H03F 3/213* (2013.01); *H03F 2200/387* (2013.01); *H03F 2200/426* (2013.01); *H03F 2200/451* (2013.01)

(58) Field of Classification Search
  CPC ......................................................... H03F 1/52
  See application file for complete search history.

(56) References Cited

U.S. PATENT DOCUMENTS

| | | | |
|---|---|---|---|
| 2003/0076145 A1* | 4/2003 | Mawet | H03K 3/0231 327/262 |
| 2005/0083129 A1* | 4/2005 | Tsurumaki | H03F 1/301 330/285 |
| 2008/0080235 A1* | 4/2008 | Tran | G11C 7/065 365/185.21 |
| 2010/0085119 A1* | 4/2010 | Samavedam | H03F 1/301 330/285 |
| 2013/0077357 A1* | 3/2013 | Zhang | H02M 3/33507 363/21.16 |
| 2014/0009201 A1* | 1/2014 | Wang | H03K 19/018514 327/333 |

* cited by examiner

*Primary Examiner* — Patricia T Nguyen
(74) *Attorney, Agent, or Firm* — Chang & Hale LLP (57) ABSTRACT

A power amplification system comprises a current source configured to provide a bias current, a current mirror configured to mirror the bias current, and a comparator configured to compare the mirrored bias current to a threshold current and, in response to the mirrored bias current exceeding the threshold current, cause a reduction of output power.

17 Claims, 11 Drawing Sheets

POWER AMPLIFIER OUTPUT POWER PROTECTION

CROSS-REFERENCE TO RELATED APPLICATION(S)

This application is a continuation of U.S. application Ser. No. 16/586,711 filed Sep. 27, 2019 and entitled "AVERAGING OVERCURRENT PROTECTION," which claims priority to U.S. Provisional Application No. 62/738,928 filed Sep. 28, 2018, entitled "AVERAGING OVERCURRENT PROTECTION," each of which is expressly incorporated by reference herein in its entirety for all purposes.

BACKGROUND

Field

The present disclosure relates to power amplifier circuits, related devices, and related methods for radio-frequency (RF) applications.

Description of the Related Art

Some power amplifier circuits include integrated duplex filters. Often, duplex filters and/or other components of power amplifier circuits can be sensitive to damage from various factors such as process variation and temperature in such a way as to decrease the overall performance of the circuit.

SUMMARY

In accordance with some implementations, the present disclosure relates to a power amplification system comprising a current source configured to provide a bias current, a current mirror configured to mirror the bias current, a comparator configured to compare the mirrored bias current to a threshold current, and a transistor at an output of the comparator. The transistor is configured to be activated in response to the mirrored bias current exceeding the threshold current.

In some embodiments, the bias current can represent an average current received at the power amplification system. In some embodiments, the threshold current can be temperature-compensated to correct for current gain variation. In some embodiments, the current source can be configured to trim the threshold current value independently for each band of the power amplification system. In some embodiments, the current mirror can include a first current mirror providing a 50:1 current ratio, a second current mirror providing a 2:1 current ratio, and a third current mirror providing a 2:1 current ratio. In some embodiments, the power amplification system can further comprise a converter configured to generate the threshold current.

In some embodiments, the power amplification system can further comprise a capacitor configured to integrate error current from the comparator. The capacitor can be configured to build charge in response to the mirrored bias current exceeding the threshold current value. In some embodiments, the capacitor can be configured to reset when there is a mode change. In some embodiments, the capacitor can be in series with a switch to ground. In some embodiments, the power amplification system can further comprise an edge counter. In some embodiments, each of the comparator, the transistor, the edge counter, and the capacitor can be integrated on a first circuit die.

In some embodiments, the current source can be a regulator. In some embodiments, the current source can provide the bias current to an output stage of the power amplification system.

In some teachings, the present disclosure relates to a method of managing current in a power amplifier. The method comprises providing a bias current to the power amplifier, mirroring the bias current at an output stage of the power amplifier, applying the mirrored bias current to a filter network to create a filtered voltage waveform, comparing a sensed voltage to a threshold voltage, and, in response to the sensed voltage exceeding the threshold voltage, activating a transistor to redirect at least a portion of the bias current away from the power amplifier.

In some embodiments, redirecting the bias current can cause reduction of a gain value of the power amplifier. Reduction of the gain value can cause reduction of output power of the power amplifier and reduction of output power can cause reduction of final stage base current of the power amplifier. In some embodiments, the bias current can represent an average current received at the power amplifier. In some embodiments, the threshold voltage can be temperature-compensated to correct for gain variation. In some embodiments, mirroring the bias current can include applying the bias current to a current mirror having a first current mirror providing a 50:1 current ratio, a second current mirror providing a 2:1 current ratio, and a third current mirror providing a 2:1 current ratio.

In some embodiments, the method can further comprise integrating error current to build a charge on capacitor in response to the sensed voltage exceeding the threshold voltage. In some embodiments, the capacitor can be configured to reset when there is a mode change. In some embodiments, the capacitor can be in series with a switch to ground.

In some embodiments, the method can further comprise providing the bias current to an output stage of the power amplifier. In some embodiments, the method can further comprise, in response to the sensed voltage exceeding the threshold voltage, providing a feedback signal to a driver stage of the power amplifier to limit the bias current.

In some implementations, the present disclosure relates to a circuit comprising a current source configured to provide a bias current, a current mirror configured to mirror the bias current, a comparator configured to compare the mirrored bias current to a threshold current, and a transistor at an output of the comparator. The transistor is configured to be activated in response to the mirrored bias current exceeding the threshold current.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DESCRIPTION

The headings provided herein, if any, are for convenience only and do not necessarily affect the scope or meaning of the claimed invention.

There is increasing demand for both higher transmission powers and lower size/cost of computing devices, including front-end module devices (e.g., smartphones, laptop/desktop computers, tablets, etc.). Some computing devices integrate duplex filters (i.e., duplexers) in a signal path between a power amplifier and an antenna of the device. However, duplex filters (e.g., temperature-compensated surface acoustic wave (TC-SAW) devices) have a finite amount of power handling and generally have lower ruggedness characteristics than other components of a signal path. The issue of duplex filter ruggedness is of particular concern for devices incorporating Carrier Aggregation, which may drive higher insertion loss and higher transmission power levels than other devices. When a device having an integrated duplex filter is subjected to excessively high powers (especially at high temperatures), the power dissipation of the device can lead to physical damage of the filter structure of the device. In order to protect the filter, some devices deliver only a limited amount of power to the filter.

Some methods for protecting filters involve utilizing a current limiting function to establish a peak (i.e., maximum) current and/or power limit. However, limiting peak current values may be less effective in protecting duplex filters than limiting average current values. This may be particularly true in the case of complex waveforms having relatively high modulation. For example, complex waveforms supported by Long-Term Evolution (LTE) and 5G standards may have a difference of over 6 dB between peak and average power levels while the margin between average power operation and potential damage conditions of modern duplex filters can be less than 6 dB. For a peak limiting function to be effective, a relatively low peak limit must be set, which may cause distortion in the waveform. Accordingly, solutions which respond to peak power levels may be challenged to maintain normal operating performance while protecting the duplex filter. A solution providing an ability to control average power while allowing for relatively high peak-to-average waveform characteristics is needed.

Insertion loss can increase at the high end of a frequency range for a filter (e.g., near the transition band). Increased insertion loss in a filter can cause more power dissipation within the filter, which can lead to higher temperatures. For some filters (e.g., surface acoustic wave devices), frequency response tends to shift down in frequency as the device temperature increases. Moreover, as the temperature of a device increases, more insertion loss is introduced which in turn translates to more power dissipation and more heating. In this way, some filters may experience positive feedback which may cause significant dissipation of energy and damage to the filter.

Some devices (e.g., cell phones) may frequently operate at power levels that may cause damage to filters in the devices if sustained for an extended period of time. For example, high power levels may be needed for calibration as well as to support peak-to-average waveforms. A filter may have a certain stress level such that extended application of power levels above the certain stress level may damage the filter. In some cases, periods of high stress (e.g., above a filter's stress level) that are approximately 300 ms or longer may cause damage to the filter. Accordingly, some embodiments described herein may be capable of operating at power levels above a filter's stress level while preventing extended operation (e.g., 300 ms) above the stress level in order to prevent damage to the filter. Calibration process periods may vary device-to-device. In some embodiments, high stress periods (e.g., operating above a filter's stress level) may be limited to approximately 10 ms.

In some embodiments, power delivered to a filter may be detected via forward power detection at the filter. However, forward power detection may require a radio frequency (RF) filter that is much more complex and expensive in terms of die area and current drain than other filters which may be used. In some embodiments, power may be detected using collector current (e.g., total output current) of the power amplifier because collector current is directly related to power. However, using collector current may require insertion of an element in series with the high current flow path, which can impact gain and efficiency.

Some embodiments described herein provide low-cost methods for autonomously limiting power delivered to filters and thereby protecting the filter from damage, particularly in extreme (e.g., high power) operation conditions. Some embodiments involve indirectly detecting average output power and providing a feedback signal into a driver stage device which may be capable of limiting the average power delivered to the filter. Because transmit power of a power amplifier may be correlated to bias current within the power amplifier, by limiting the bias current in the power amplifier, the power delivered to the load of the power amplifier can be effectively limited.

Some embodiments provide, through use of a relatively long time constant, a capability of driving high powers for several milliseconds before internally reducing gain to protect the filter from damage. The time constant for a filter comprising a resistor and capacitor network is the product of the resistance and capacitance of the network. If a step function is applied to the filter, the output voltage follows the equation $V_{OUT}=V_{IN}*(1-e^{(t/RC)})$. A relatively large RF signal can act as a step function for the network and it can take time for the output of the filter to charge a capacitor of the network and engage the protection loop. The charging time is defined by the network time constant. A capacitor may charge to 95% of a final charge value in a period of time equivalent to three successive time constant periods. For a low-pass filter, a 3 dB bandwidth can be found using the following formula for cutoff frequency ($F_C$): $F_C=1/(2*\pi RC)$. Accordingly, any signal content at frequencies greater than $F_C$ can be attenuated and any signals lower than $F_C$ can pass through. The DC value is lower than $F_C$ and therefore passes through to deliver the average value of the signal. In this way, the time constant can provide an averaging function which can allow a feedback loop to respond to average power, thereby supporting high peak-to-average ratios of complex waveforms.

Utilizing the indirect relationship between heterojunction bipolar transistor (HBT) power amplifier output power and final stage (e.g., output stage) base current, an analog buffer circuit can be used to source the base bias current to the amplifier final stage and sense the current by means of mirroring it at a ratio of 200:1 on a CMOS companion die. The mirrored current can then be compared against a current limit threshold current through current subtraction. Resulting error current can be integrated with a large value capacitance. During extreme operating conditions, the base current can exceed the threshold and cause the feedback circuitry to reduce the reference bias current for the driver stage amplifier. Reduction of the bias current results in reduced gain which reduces the output power and likewise the final stage base current. Given that the relationship between power and base current is a function of HBT device current gain (i.e., beta), radio frequency signal loss can vary between devices and operating bands, and on-die resistance can vary with process. The threshold can be trimmed at a final test. The threshold can be temperature-compensated to correct for HBT beta variation over ambient temperature.

By allowing a limiting circuit to respond to average power rather that peak power, system margin may be increased, particularly for waveforms having a high peak-to-average characteristic. Some embodiments may utilize simple direct current (DC) sensing technologies, thereby avoiding use of complex radio frequency detectors (which can drive more complex silicon process technologies) and increased input/output and interfacing between the HBT and silicon control die.

In certain embodiments, a device may include an HBT. In some cases, there can be a relationship between collector current (i.e., total output current) and the base current of an HBT. Therefore, the base current may be used to indirectly detect forward power (which is related to current). The relationship between base current and collector current is a function of beta (i.e., current gain). Beta varies with temperature and process. Accordingly, in order to use base current detection, it is necessary to compensate for temperature and also perform process trimming to obtain accurate device-to-device detection.

With respect to detector current, the base current (or collector current) is a representation of the instantaneous envelope power. A peak-to-average characteristic or a crest factor for many waveforms may be around 4 decibels.

Figure 1:
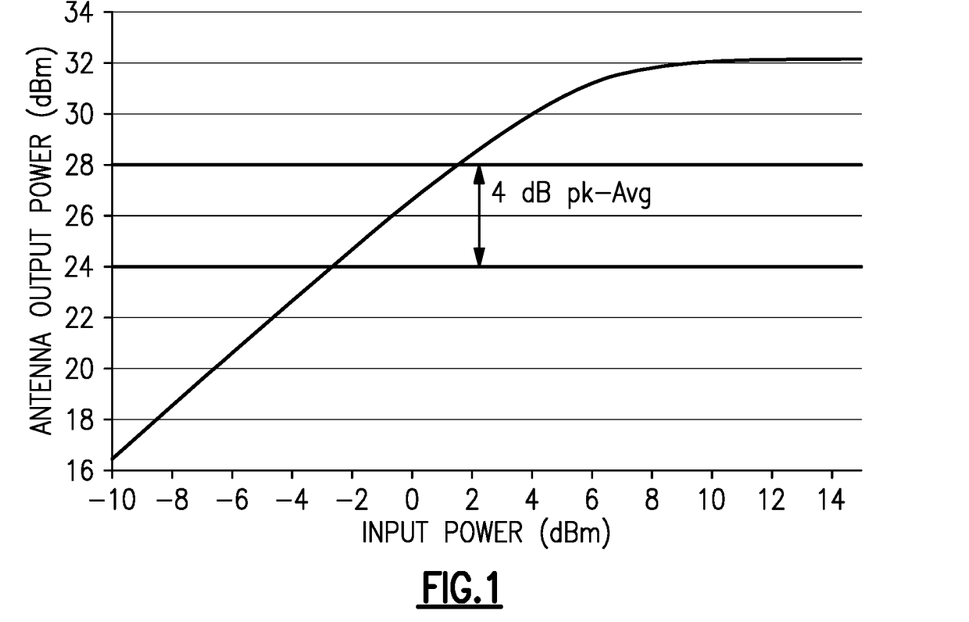
FIG. 1 provides a graph showing output power as a function of input power for an example power amplifier.

FIG. 1 provides a graph showing output power as a function of input power for an example power amplifier. A typical power amplifier may have approximately 26-28 decibel-milliwatts (dBm) gain. In order for linear operation, it may be required to operate below the compression characteristic of the amplifier. As shown in FIG. 1, operation may be backed off approximately 4-6 dBm below the compression characteristic to cause an approximately 4 dBm peak-to-average characteristic of the waveform. Accordingly, the waveform may transition along the 4 dBm peak-to-average on the gain profile.

Figure 2:
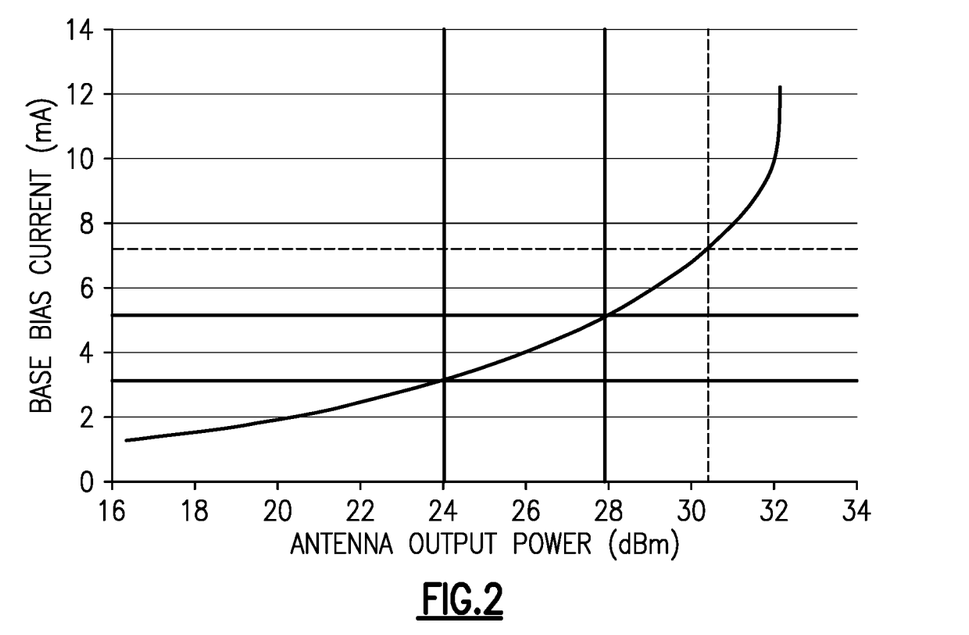
FIG. 2 provides a graph showing base bias current values as a function of output power over a power window.

FIG. 2 provides a graph showing base bias current values as a function of output power over a power window. As shown in FIG. 2, operating along 24-28 dBm power may correlate to 4-6 mA of base bias current. As the amplifier moves beyond the target operation range (e.g., to 31 or 32 dBm), a base current of 8-12 mA may be reached.

Figure 3:
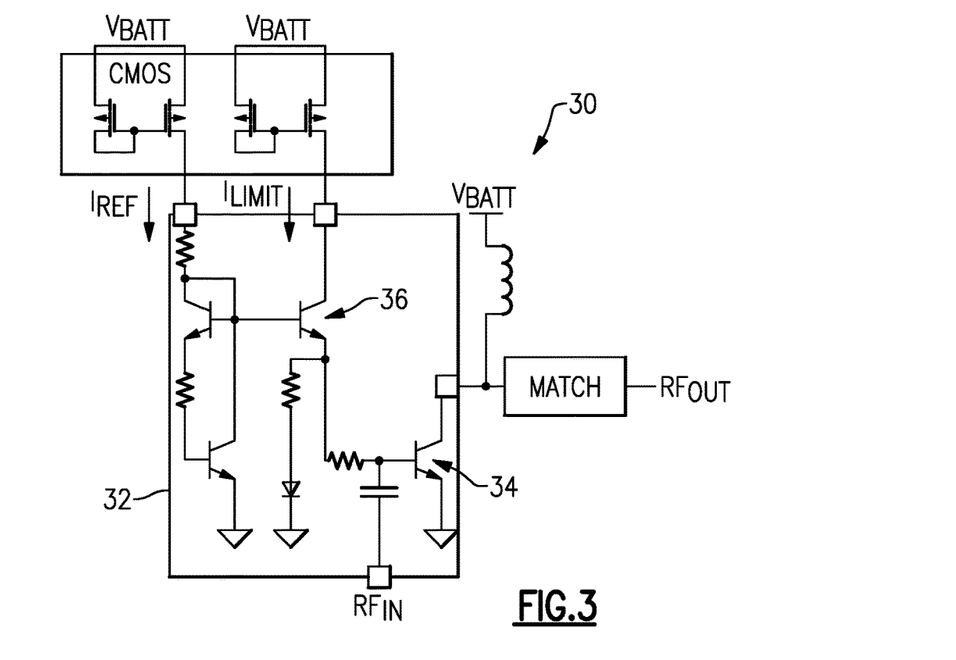
FIG. 3 illustrates an example power amplifier circuit for providing a peak base current limiting function in accordance with some embodiments described herein.

FIG. 3 illustrates a power amplifier circuit 30 for providing a peak base current limiting function. The circuit 30 comprises an HBT 32 including a power transistor 34 and an emitter follower 36. The collector of the emitter follower 36 receives a limiting current ("Ilimit") that is representative of the base current for the final stage of the power amplifier circuit 30. If the power amplifier circuit 30 draws more base current than the limiting current, the bias in the emitter follower 36 may collapse and the current of the power amplifier circuit 30 may no longer increase with increased power. By modifying the limiting current, it can be determined how the limiting current impacts the power amplifier waveform characteristics in terms of linearity and gain and also whether there are ruggedness improvements in the filter.

In some cases, gain characteristics may be a function of current limiting. For example, by lowering the limiting current, there may be an effective limit of power (e.g. at 29 dBm). Conversely, as the limiting current increases, a power amplifier may be capable of delivering higher and higher power levels.

When current limiting is used, an effective current (e.g., base current) may level out when it exceeds a limiting value (e.g., 9.5 mA). When current limiting is disabled, the effective current may continue well above the limiting value. For a device including a filter, a current limiting function can cause drastic changes in power (and possibly filter failure) when a given phase angle is reached. However, a current limiting function that includes components for limiting forward power may provide relatively high ruggedness performance. In some cases, focusing on average current may provide for better prediction of average power delivered to a device.

Figure 4:
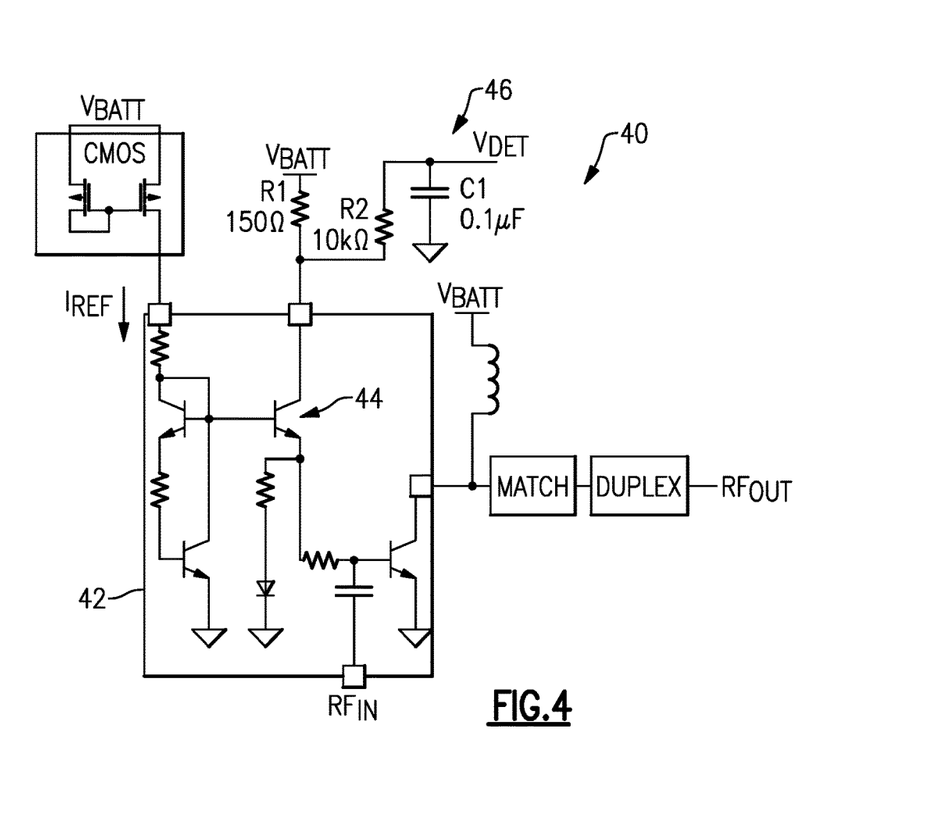
FIG. 4 provides a schematic diagram of a circuit comprising a power amplifier in accordance with some embodiments.

FIG. 4 provides a schematic diagram of a circuit 40 comprising a power amplifier 42. The power amplifier 42 includes an emitter follower 44 connected to a filter system 46 which transfers base current to a voltage across a 150 killi-ohm (kΩ) resistor and then applies a resistor-capacitor (RC) filter comprising a 10 kΩ resistor and a 0.1 μF capacitor.

Figure 5:
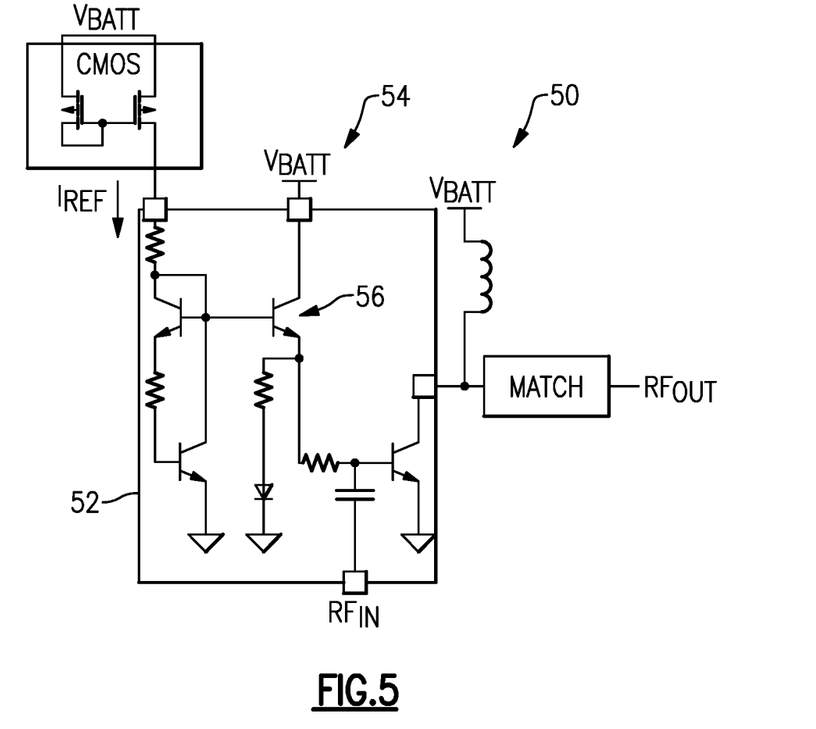
FIG. 5 provides a schematic diagram of a circuit comprising a power amplifier bias interface in accordance with some embodiments.

FIG. 5 provides a schematic diagram of a circuit 50 comprising a power amplifier bias interface. As shown in FIG. 5, a battery voltage source ("Vbatt") 54 may provide a collector voltage to an emitter follower 56. The emitter follower 56 may provide a base current to a power amplifier 52. By providing a regulated voltage to the Vbatt 54 signal, the amount of current being sourced to the Vbatt 54 from the regulator can be monitored. A reference current (IREF) signal may set up a quiescent bias for the power amplifier 52. If the IREF is stolen away from the power amplifier 52, the quiescent current and gain of the power amplifier 52 may be reduced. By reducing the gain, the output power and the sensed base current may be reduced.

Figure 6:
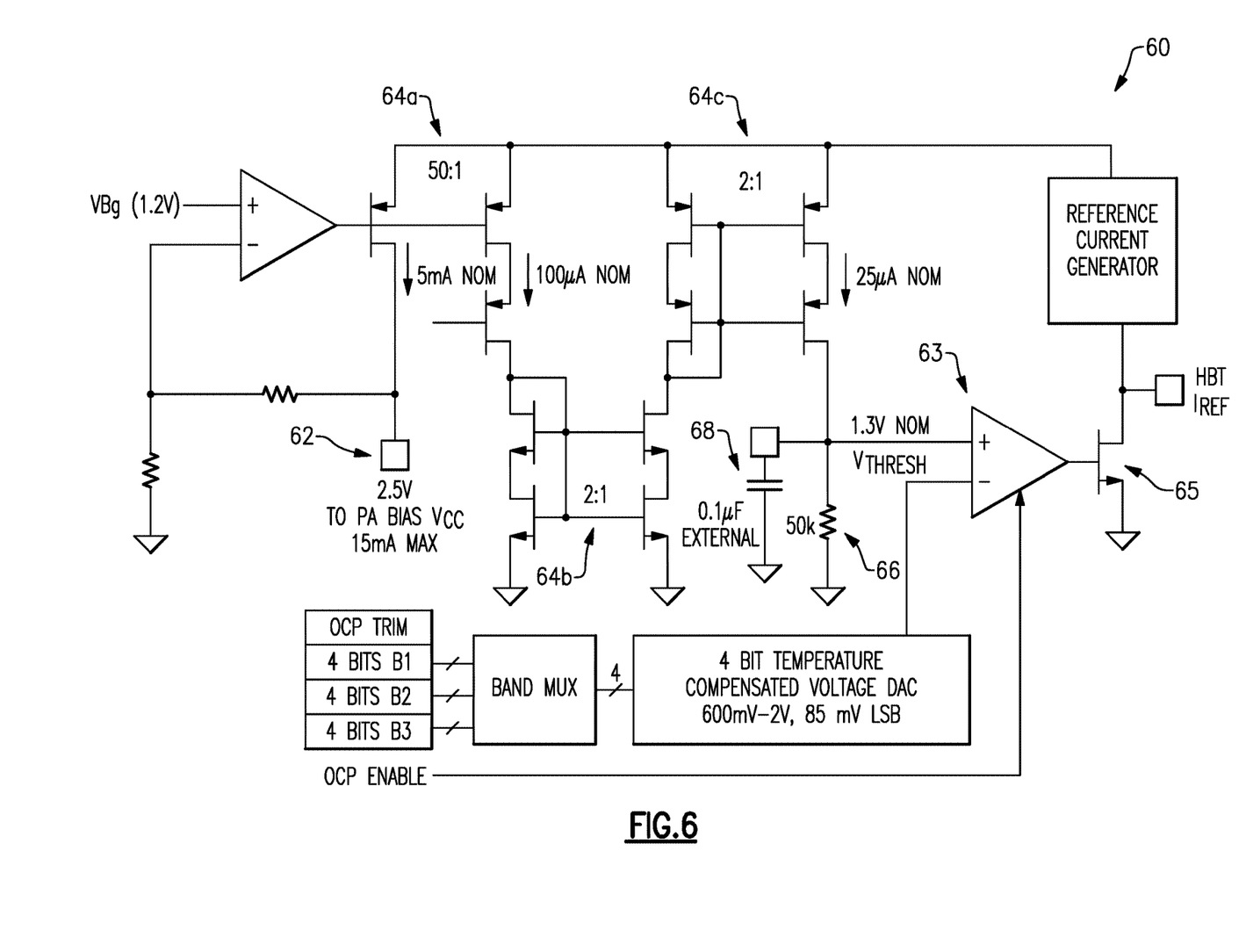
FIG. 6 provides a schematic diagram of a power amplifier for limiting average base current in accordance with some embodiments.

FIG. 6 provides a schematic diagram of a power amplifier 60 for limiting average base current. The power amplifier 60 includes a regulator 62 providing a bias to the power amplifier 60. In some cases, the regulator 62 may provide a 2.5 volt (V) bias to the power amplifier 60. The current of the power amplifier 60 may be mirrored through use of one or more current mirrors. As shown in FIG. 6, the power amplifier 60 may include a first current mirror 64a (e.g., providing a 50:1 current ratio), a second current mirror (e.g., providing a 2:1 current ratio), and a third current mirror (e.g., providing a 2:1 current ratio), creating an effective ratio of 200:1 for the power amplifier 60. For example, if a base current for the power amplifier 60 is 5 mA, a nominal 20 μA sense signal may be processed. The 20 μA sense signal may be used to either generate and filter a voltage or perform an integration on a current comparison circuit.

In one embodiment, the mirrored current may be applied to a 50 kΩ resistor 66 in parallel with a large value capacitance 68 (e.g., a 0.1 μF capacitor) to create a filtered voltage waveform. The sensed voltage may be compared through use of a comparator 63 to a threshold voltage ("Vthresh"). If the sensed voltage exceeds the threshold voltage, a transistor 65 at the output of the comparator 63 can be activated, thereby redirecting at least a portion of the bias current from the power amplifier 60 to reduce the gain of the power amplifier 60.

Current may be sourced to the base, sensed, and compared against a threshold. If the threshold is exceeded, reference current is taken which in turn reduces the base current and drops the sensed voltage below the threshold voltage.

Because beta is temperature-varying, in some embodiments, a threshold value may be temperature-compensated. For example, as temperature increases, the threshold may increase (e.g., a base current threshold may increase) because beta decreases with increasing temperature. A threshold may have multiple settings. For example, each band of a power amplifier can have different gain characteristics and there may be different matching characteristics in the output match to a duplexer, and/or the duplexer filter itself may have different ruggedness levels. Accordingly, some embodiments may be configured to trim a threshold value to set the threshold independently for each of the bands. As the power amplifier is configured for a first band, a first threshold associated with the first band may be used and as the power amplifier is changed for a different band, a different threshold may be used.

In some cases, there may be a delay period for detecting that a threshold is exceeded. For example, for a power amplifier having a 0.1 μF capacitance, it may take approximately 10 ms before a device detects that the threshold is exceeded and the device begins trimming the output power. Different capacitance values may result in different response times.

Figure 7:
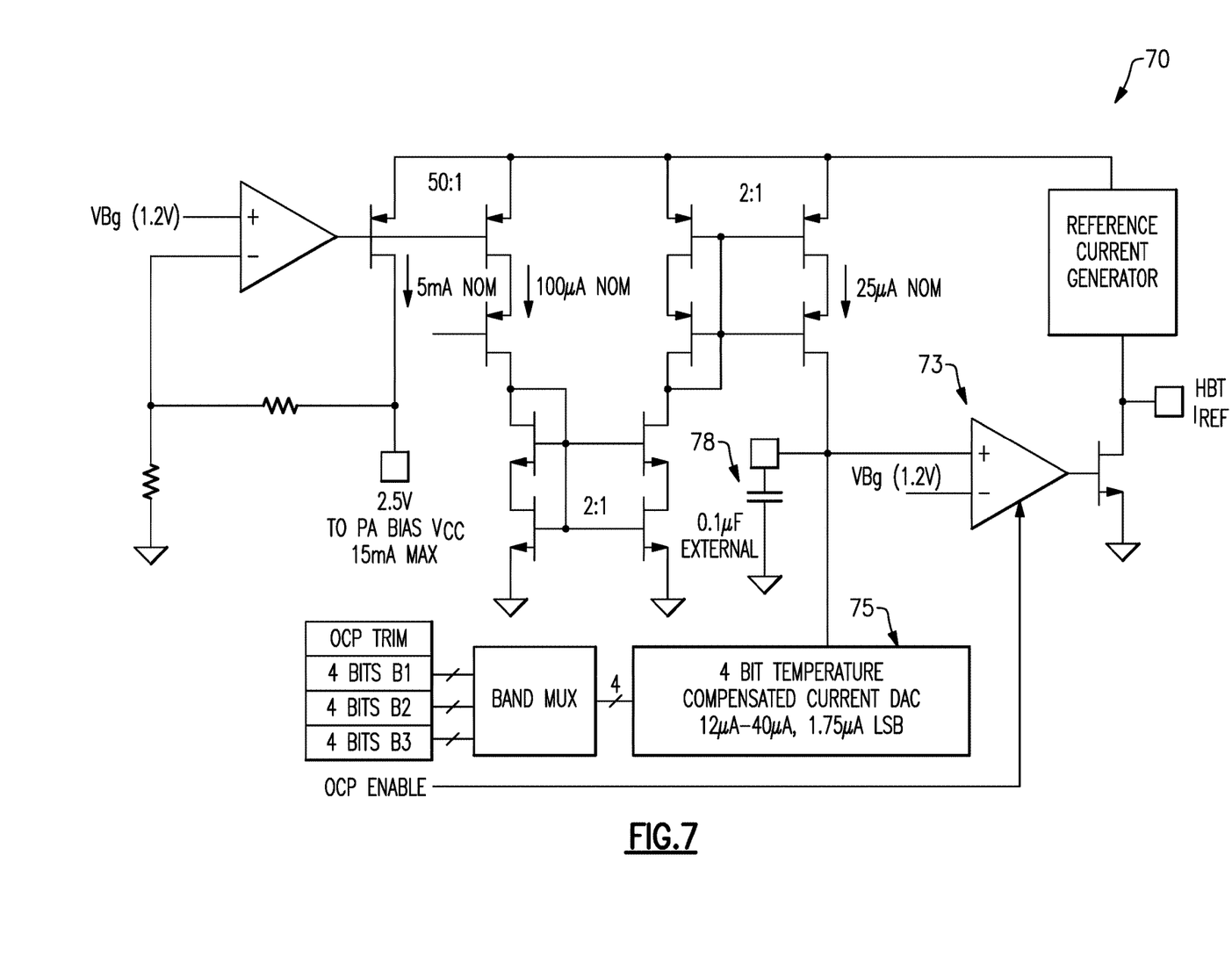
FIG. 7 provides a schematic diagram of a current comparison device in accordance with some embodiments.

FIG. 7 shows a schematic diagram of a current comparison device 70. The device 70 comprises a comparator 73 that may be configured to compare a sensed current to a current reference. The current reference/threshold may be generated by a temperature-compensated current digital-to-analog converter (DAC) 75. A capacitor 78 (e.g., a 0.1 μF capacitor) may effectively integrate an error current. If the sensed current exceeds the threshold current then charge can build on the capacitor 78 and eventually the sensed current may exceed the threshold current at the comparator 73 and the current may be reduced. The DAC current may be temperature-compensated and selectable between multiple band settings.

Figure 8:
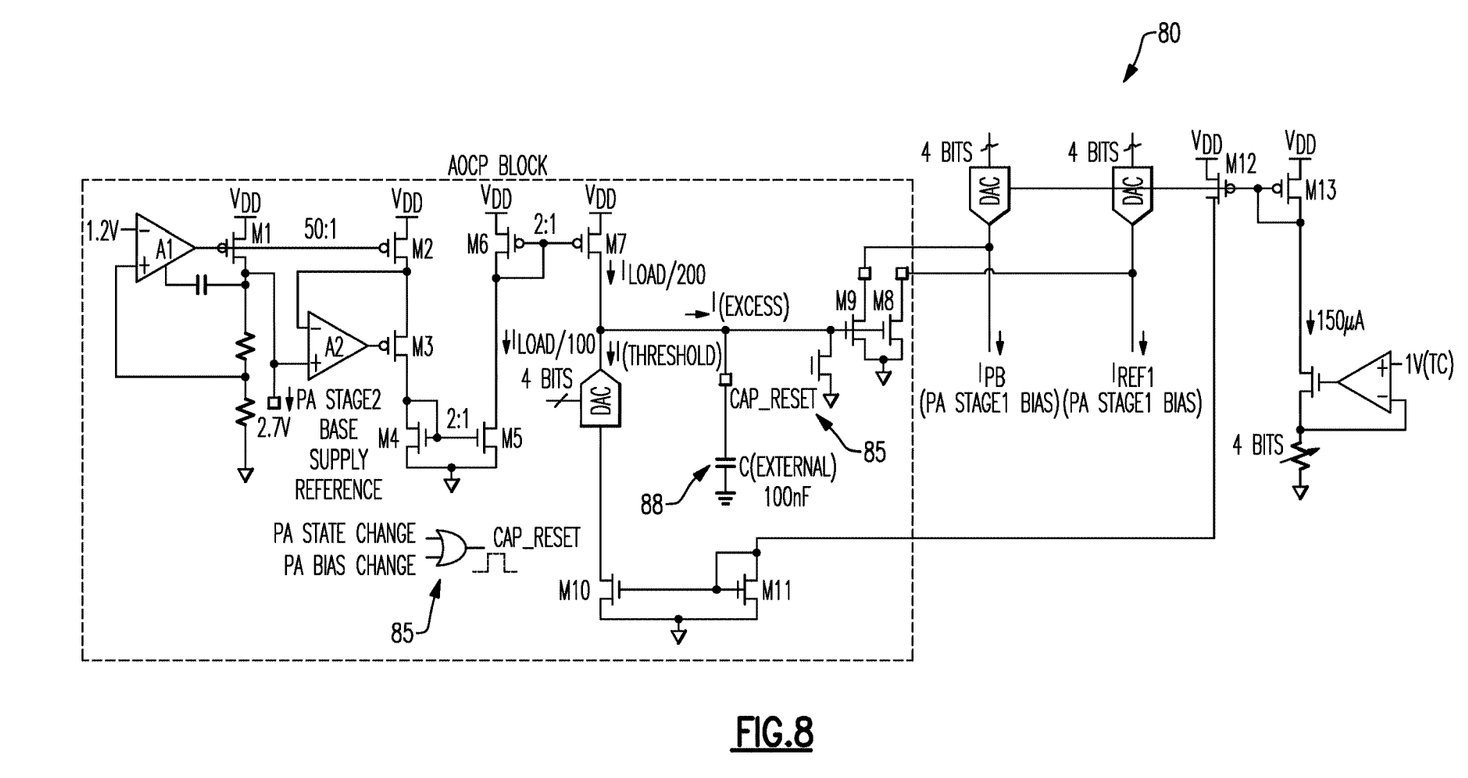
FIG. 8 provides a schematic diagram of a circuit for averaging overcurrent protection in accordance with some embodiments.

FIG. 8 provides a schematic diagram of a circuit 80 for averaging overcurrent protection. A capacitor may require a period of time (e.g., approximately 10 ms) to charge. In some power amplifiers, a charge stored at a capacitor (e.g., the capacitor 78 in FIG. 7) can impact operation of the power amplifier when the state of the amplifier is changed. For example, if operation is changed to a different band, any charge stored on the capacitor could potentially impact operation of the new band. In some embodiments, a provision may be utilized to reset the capacitor when there is a mode change in the power amplifier. As shown in FIG. 8, the power amplifier 80 may comprise a switch 85 to ground on the capacitor 88 so that when a mode change or bias change occurs, any charge on the capacitor 88 is removed and the system 80 is reset to allow for operating from a known starting point in the new mode.

Figure 9:
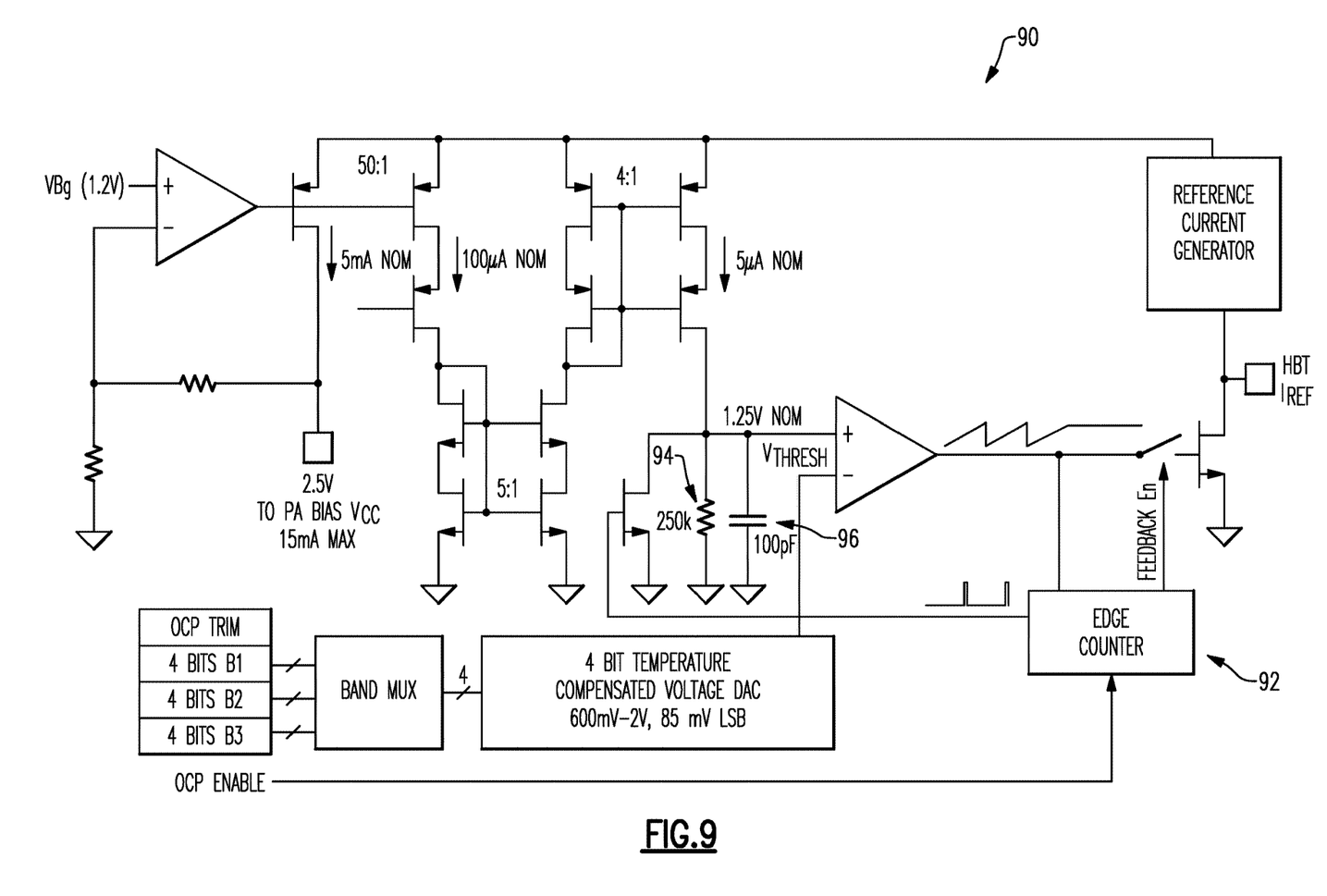
FIG. 9 provides a schematic diagram representing a current monitoring device with reduced capacitor magnitude in accordance with some embodiments.

FIG. 9 provides a schematic diagram representing a current monitoring device 90 with reduced capacitor magnitude. In some embodiments, due to the size of the capacitor (e.g., a 0.1 μF or 0.01 μF capacitance), the capacitor must be discrete and may be situated external to the integrated circuit of the device. However, through use of an edge counter 92, capacitance may be integrated on the circuit die. For example, as shown in FIG. 9, the device 90 may comprise a 250 kΩ resistor 94 and a 100 pF capacitor 96. Using an edge counter 92, it can be determined how many times the reference current charges up to the threshold. By setting the number of edge counts, the time constant can be multiplied by the number of edge counts. A time constant of the reference current may be multiplied.

Figure 10:
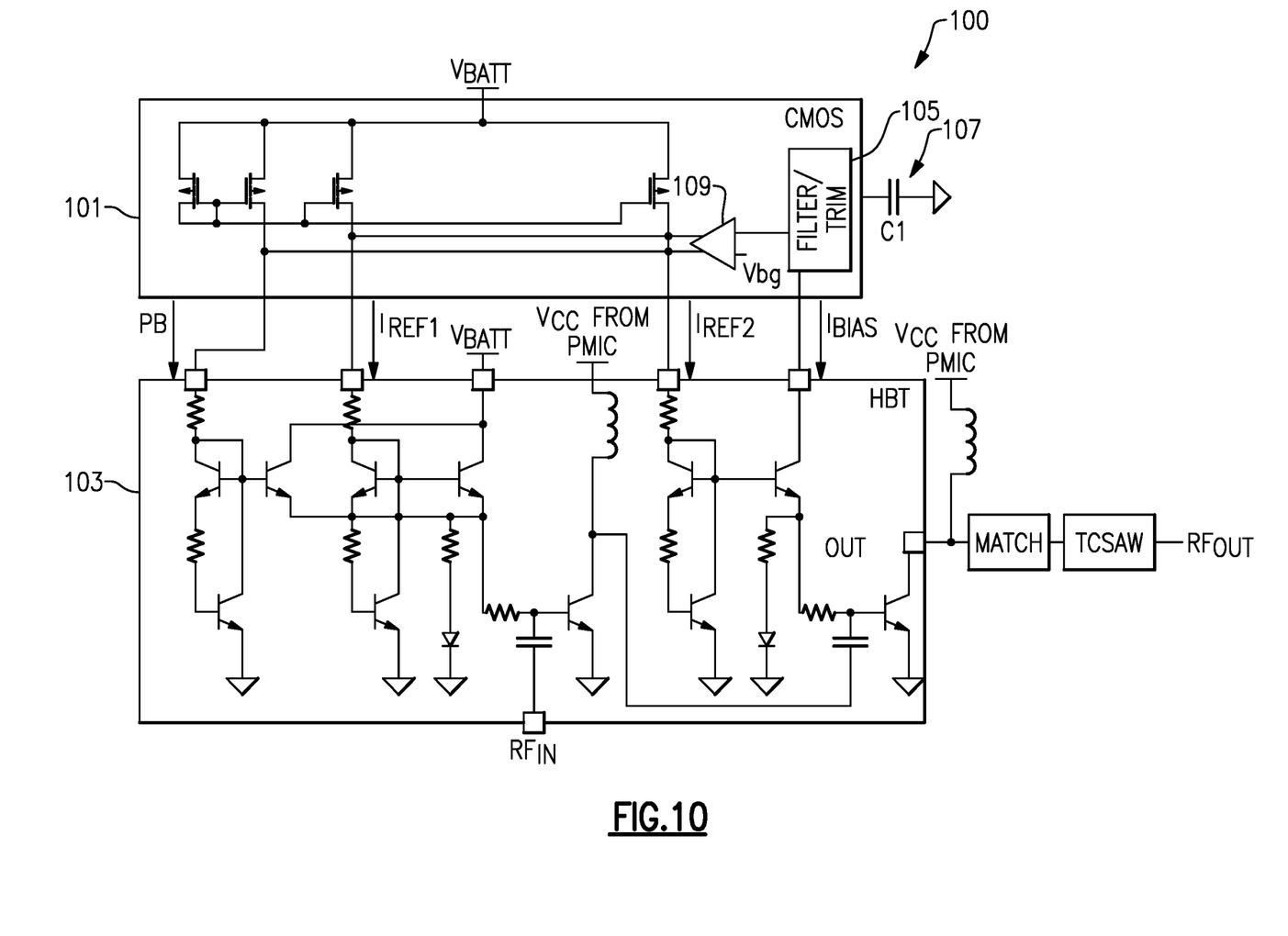
FIG. 10 shows a schematic diagram of an interface between a control die and an HBT in accordance with some embodiments.

FIG. 10 shows a schematic diagram of an interface between a control die 101 and an HBT 103. The control die 101 comprises a filter/trim circuit 105 that provides a base bias current ("Ibias") to the final stage of the HBT 103. An error current at a capacitor 107 may be integrated and when an error voltage exceeds the band gap in a comparator 109, a reference current ("IRef1") in the power amplifier is reduced. The closed loop system works to reduce gain of the driver stage of the amplifier based on the sensed current in the final stage.

In some embodiments, the power amplifier may be adjusted to a target power threshold based on the needs of the system. Threshold bits in the current clamp architecture may be adjusted until output power is reduced, indicating that the power that the amplifier is set to is equivalent to the threshold of the loop. The target power threshold may be written and/or burned into the die and a calibrated threshold may be set for each band.

Figure 11:
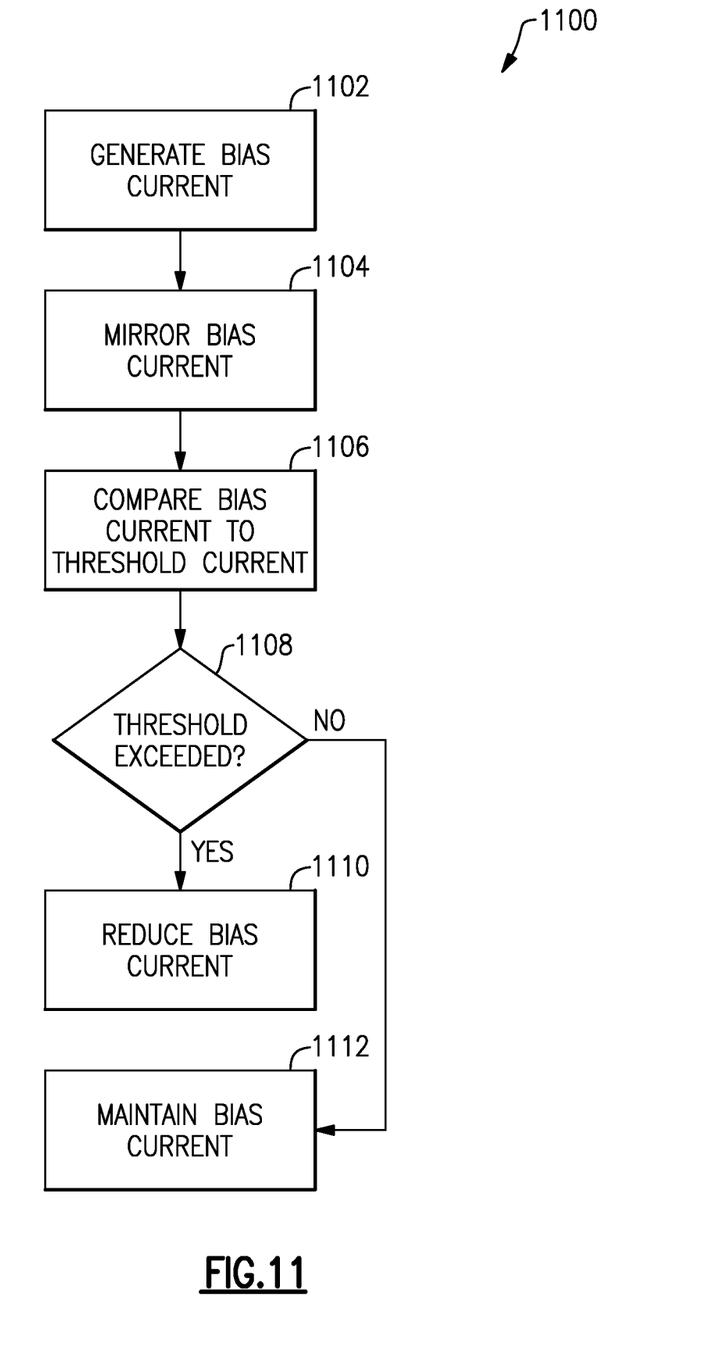
FIG. 11 shows a process for limiting average current values at a power amplifier that can be implemented with embodiments herein.

FIG. 11 shows a process 1100 for limiting average current values at a power amplifier that can be implemented with embodiments herein. Steps of the process 1100 may be performed in any order and in some cases steps may be removed and/or added as needed.

In block 1102, a bias current may be generated. In some embodiments, the bias current may represent an average current value of the power amplifier.

In block 1104, the bias current may be mirrored. In some embodiments, mirroring may involve delivering the bias current to multiple current mirrors. For example, the power amplifier may comprise three current mirrors providing variable current ratios.

In block 1106, the mirrored bias current may be compared to a threshold current. The comparison may be performed at a comparator. In some embodiments, the threshold current may be temperature-compensated and/or may be individually set for each band of the power amplifier.

In decision block 1108, it is determined whether the mirrored bias current exceeds the threshold current. If the threshold is exceeded, in block 1110 the bias current may be reduced. In some embodiments, bias current may be redirected to reduce the bias current of the power amplifier. If the threshold is not exceeded, in block 1112 the bias current level may be maintained.

Figure 12:
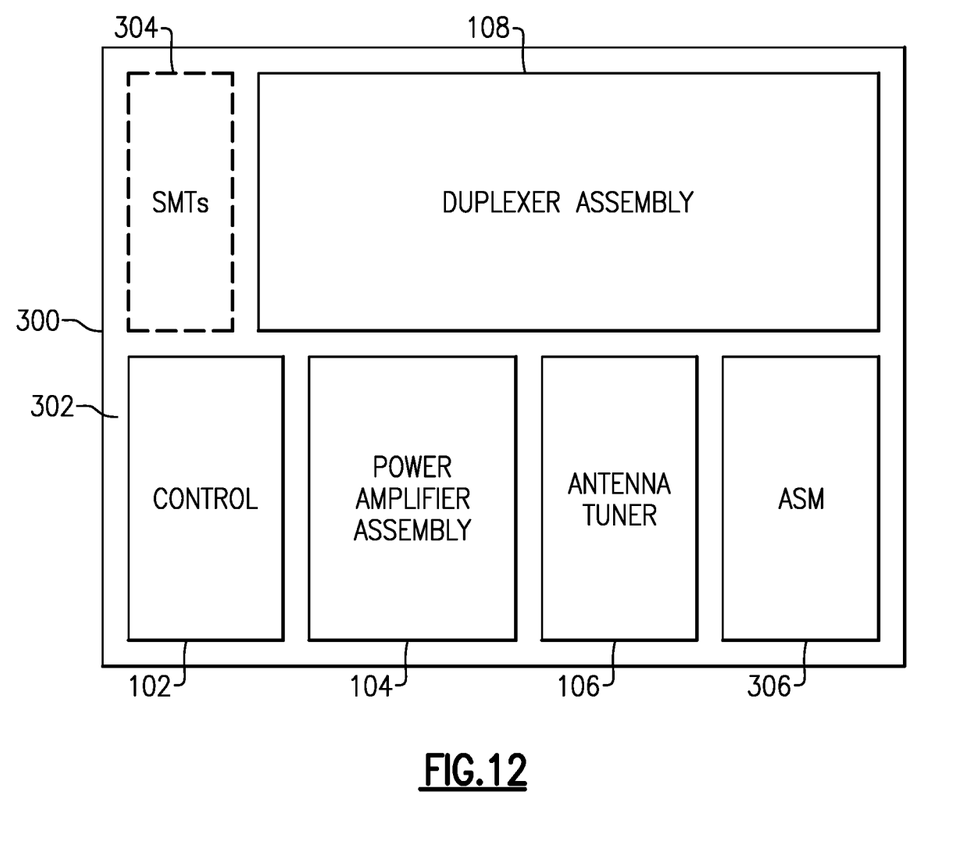
FIG. 12 shows a module including some or all of a front-end architecture having one or more features as described herein.

FIG. 12 shows that in some embodiments, some or all of a front-end architecture having one or more features as described herein can be implemented in a module. Such a module can be, for example, a front-end module (FEM). In the example of FIG. 12, a module 300 can include a packaging substrate 302, and a number of components can be mounted on such a packaging substrate. For example, a control component 102, a power amplifier assembly 104, an antenna tuner component 106, and a duplexer assembly 108 can be mounted and/or implemented on and/or within the packaging substrate 302. Other components such as a number of SMT devices 304 and an antenna switch module (ASM) 306 can also be mounted on the packaging substrate 302. Although all of the various components are depicted as being laid out on the packaging substrate 302, it will be understood that some component(s) can be implemented over other component(s).

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 13:
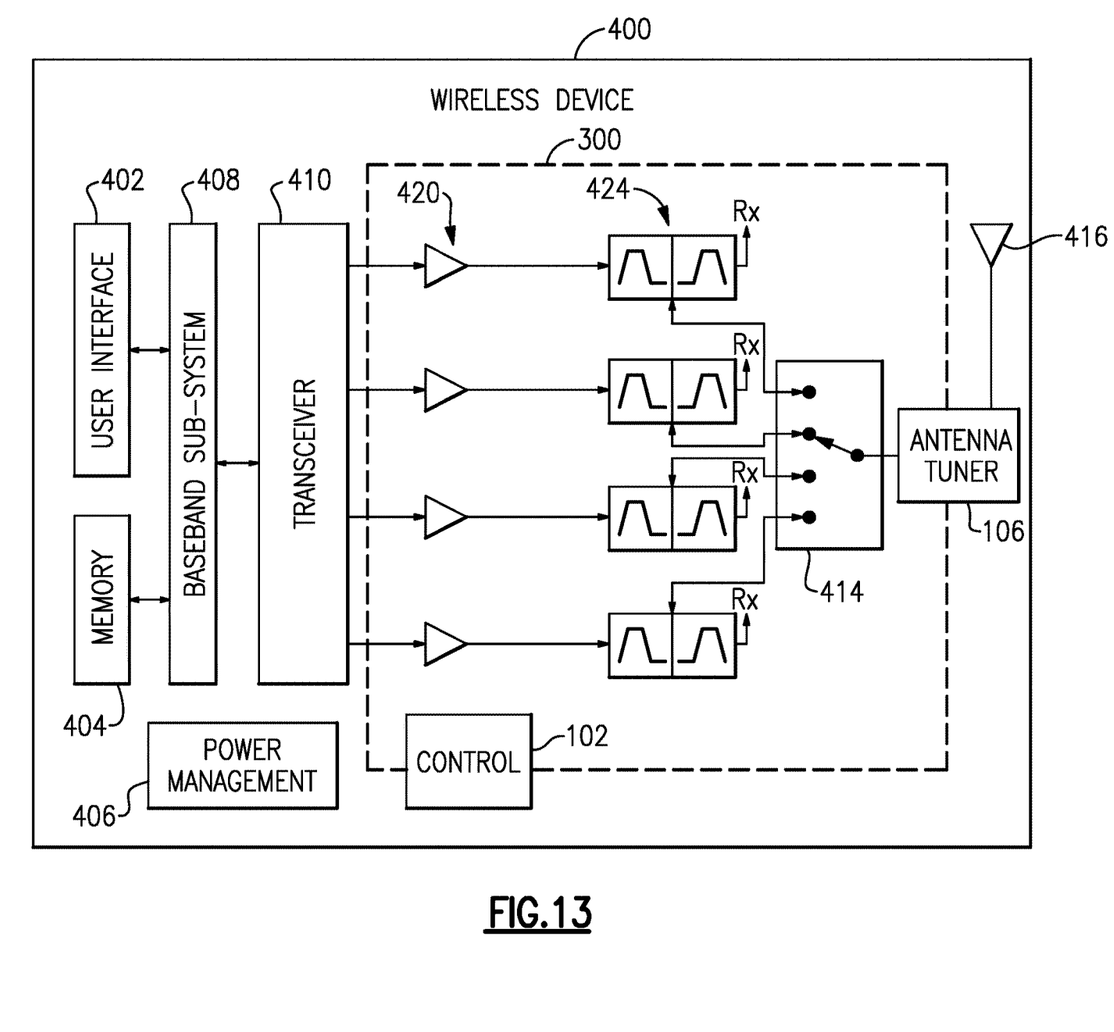
FIG. 13 depicts an example wireless device having one or more advantageous features described herein.

FIG. 13 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 13, power amplifiers 420 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be routed to their respective duplexers 420. Such amplified and filtered signals can be routed to an antenna 416 through an antenna switch 414 for transmission. In some embodiments, the duplexers 420 can allow transmit and receive operations to be performed simultaneously using a common antenna (e.g., 416). In FIG. 13, received signals are shown to be routed to "Rx" paths (not shown) that can include, for example, a low-noise amplifier (LNA).

As described herein, one or more features of the present disclosure can provide a number of advantages when implemented in systems such as those involving the wireless device of FIG. 13. For example, a controller 102, which may or may not be part of the module 300, can monitor base currents associated with at least some of the power amplifiers 420. Based on such monitored base currents, an antenna tuner 106 (which may or may not be part of the module 300), can be adjusted to provide a desired impedance to the corresponding power amplifier.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
   a current source configured to provide a bias current;
   a current mirror configured to mirror the bias current; and
   a comparator configured to compare the mirrored bias current to a threshold current and, in response to the mirrored bias current exceeding the threshold current, cause a reduction of output power;
   wherein the current mirror includes a first current mirror providing a 50:1 current ratio, a second current mirror providing a 2:1 current ratio, and a third current mirror providing a 2:1 current ratio.

2. The power amplification system of claim 1 wherein the bias current represents an average current received at the power amplification system.

3. The power amplification system of claim 1 wherein the threshold current is temperature-compensated to correct for current gain variation.

4. A power amplification system comprising:
   a current source configured to provide a bias current;
   a current mirror configured to mirror the bias current; and
   a comparator configured to compare the mirrored bias current to a threshold current and, in response to the mirrored bias current exceeding the threshold current, cause a reduction of output power;
   wherein the current source is configured to trim a value of the threshold current independently for each band of the power amplification system.

5. The power amplification system of claim 1 further comprising a capacitor configured to integrate error current from the comparator, the capacitor configured to build charge in response to the mirrored bias current exceeding the threshold current.

6. The power amplification system of claim 5 wherein the capacitor is configured to reset when there is a mode change.

7. The power amplification system of claim 5 further comprising an edge counter.

8. The power amplification system of claim 7 wherein each of the comparator, the edge counter, and the capacitor are integrated on a first circuit die.

9. The power amplification system of claim 1 wherein the current source provides the bias current to an output stage of the power amplification system.

10. A method of managing output power in a power amplifier, the method comprising:

increasing output power;
comparing a mirrored bias current to a threshold current; and
in response to the mirrored bias current exceeding the threshold current, reducing the output power;
wherein the mirrored bias current is generated by applying a bias current to a current mirror having a first current mirror providing a 50:1 current ratio, a second current mirror providing a 2:1 current ratio, and a third current mirror providing a 2:1 current ratio.

11. The method of claim 10 wherein the output power is increased during a calibration process.

12. The method of claim 10 further comprising, in response to the mirrored bias current exceeding the threshold current, reducing a bias current to cause a reduction of the output power.

13. The method of claim 10 further comprising integrating error current to build a charge on capacitor in response to the mirrored bias current exceeding the threshold current.

14. The method of claim 13 wherein the capacitor is configured to reset when there is a mode change.

15. A circuit die comprising:
a current source configured to provide a bias current;
a current mirror configured to mirror the bias current; and
a comparator configured to compare the mirrored bias current to a threshold current and, in response to the mirrored bias current exceeding the threshold current, cause a reduction of output power;
wherein the current mirror includes a first current mirror providing a 50:1 current ratio, a second current mirror providing a 2:1 current ratio, and a third current mirror providing a 2:1 current ratio.

16. A circuit die comprising:
a current source configured to provide a bias current;
a current mirror configured to mirror the bias current; and
a comparator configured to compare the mirrored bias current to a threshold current and, in response to the mirrored bias current exceeding the threshold current, cause a reduction of output power;
wherein the bias current represents an average current at the circuit die.

17. The circuit die of claim 15 wherein the threshold current is temperature-compensated to correct for current gain variation.

* * * * *